United States Patent [19]

Aceti et al.

[11] Patent Number: 4,703,543

[45] Date of Patent: Nov. 3, 1987

[54] WIRE INSERTION APPARATUS FOR INSULATION DISPLACEMENT TERMINAL

[75] Inventors: John G. Aceti, Princeton Junction; Robert E. Schneller, Bricktown, both of N.J.

[73] Assignee: RCA Corporation, Princeton, N.J.

[21] Appl. No.: 751,900

[22] Filed: Jul. 5, 1985

[51] Int. Cl.[4] .............................................. H05K 13/06

[52] U.S. Cl. .................................. 29/33 M; 29/566.1; 29/749

[58] Field of Search ................ 29/33 M, 564.6, 566.2, 29/566.3, 566.4, 739, 747, 748, 749, 750, 850, 863, 866, 884, 544.8; 140/139, 147; 81/9.51

[56] References Cited

U.S. PATENT DOCUMENTS

| | | | |
|---|---|---|---|
| 1,473,256 | 11/1923 | Shuster | 140/147 X |
| 2,160,908 | 6/1939 | Robinson | 140/147 X |
| 3,460,238 | 8/1969 | Christy et al. | 29/481 |
| 3,734,386 | 5/1973 | Hazel | 228/5 |
| 3,789,482 | 2/1974 | Ray | 29/749 |
| 3,866,294 | 2/1975 | McCaughey | 29/203 |
| 4,190,890 | 2/1980 | Marv | 29/748 X |
| 4,238,874 | 12/1980 | Chandler et al. | 29/33 M |
| 4,271,573 | 6/1981 | von Roesgen | 29/33 |
| 4,335,497 | 6/1982 | Casey | 29/748 X |
| 4,387,509 | 6/1983 | Dechelette | 29/850 |
| 4,399,842 | 8/1983 | Gibbons | 140/92.1 |
| 4,437,603 | 3/1984 | Kobayashi et al. | 228/4.5 |
| 4,461,061 | 7/1984 | Rock | 29/33 |
| 4,566,164 | 1/1986 | Brown et al. | 29/33 M |

FOREIGN PATENT DOCUMENTS

| | | | |
|---|---|---|---|
| 1813178 | 6/1970 | Fed. Rep. of Germany | 140/147 |
| 705713 | 6/1970 | U.S.S.R. | 29/33 |

OTHER PUBLICATIONS

Operator's Manual for Thermosonic Ball Bonding Machine, Section 3, 1412/1413 Operation, Kulicke Soffa, Horsham, Pa.

*Primary Examiner*—Gil Weidenfeld
*Assistant Examiner*—Glenn L. Webb
*Attorney, Agent, or Firm*—William Squire; Fred Jacob; Allen LeRoy Limberg

[57] ABSTRACT

A robotically operated wire insertion apparatus for insulation displacement terminals (IDTs) automatically feeds wire to a wire insertion hand, automatically straightens the wire during the feeding so that the wire is aligned with the hand, inserts the wire progressively into a plurality of IDTs and severs the wire from the last inserted IDT, and initializes the apparatus to begin a new wiring cycle. The IDTs may have any orientation in any plane on one or more different substrates.

16 Claims, 8 Drawing Figures

WIRE INSERTION APPARATUS FOR INSULATION DISPLACEMENT TERMINAL

This invention relates to apparatus for automatically attaching a length of insulated wire to an insulation displacement terminal.

Terminals for receiving insulated wires directly which do not require that the insulation first be removed and which automatically cut into the insulation and deform the wire to make a reliable electrical connection, are in wide use and are known as insulation displacement terminals (IDTs). Such a terminal includes at least one bifurcated element forming a pair of spaced tines. The spacing between the tines is smaller than the diameter of the conductor of the insulated wire to be connected to the terminal. When an insulated conductor is pushed into the space between the tines, the insulation is cut by the tines so that each tine makes electrical contact with the conductor. The insertion of the wire scrapes away any contamination on the surface of the conductor and the tines, deforming the conductor and bringing fresh metal surfaces of the conductor and the tines together in compression.

One example of the use of such terminals is illustrated in U.S. Pat. No. 4,387,509. A particular terminal which might be useful in the above-mentioned patent is disclosed in U.S. Pat. No. 4,118,103. Another IDT which would be useful in the embodiment of the aforementioned U.S. Pat. No. 4,387,509 is a terminal known as "Quadra-mate" manufactured by AMP, Inc., shown in their Standard Products Catalog/3, Third Edition, Catalog 2005-8, issued August 1983, page 479.

There are automatic apparatuses for pushing wires onto IDTs such as shown in U.S. Pat. Nos. 4,461,061 and 4,271,573. However, the substrates need to be in a given plane orientation, e.g., horizontal. In printed circuit boards as used in electronic systems, for example, television receivers and the like, a large percentage of the wiring is designed into the conductors of the printed circuit board. As occurs in such system designs, there sometimes arises a need to connect one or more discrete wires from point to point on a circuit board, from one printed circuit board to another in different orientations, e.g., horizontal, vertical, and so forth, or from component to component which also may have such different orientations. The wiring of such discrete point-to-point arrangements automatically in different plane orientations can not be easily achieved by present automatic wiring apparatuses. An additional problem is that the wire fed to the pushing hand tends to be misaligned therewith.

A wire insertion apparatus according to the present invention robotically attaches a portion of an insulated wire to an insulation displacement terminal (IDT). The robot includes an arm displaceable to any given orientation in any given plane. The apparatus comprises support means adapted to be attached to a robotic arm at a reference location on the arm. A wire insertion tool depends from the support means and includes a wire insertion hand aligned relative to the support means. The hand is adapted to mate with the IDT for pushing the wire portion into engagement with the terminal in response to a given displacement of the arm. The tool includes feed means for automatically feeding the wire portion into alignment with the hand at the beginning of a wiring cycle and wire severing means for automatically selectively severing the portion at the hand from the feed means at the end of the wiring cycle to thereby permit connection of a wire to multiple IDTs regardless their relative orientation and plane location.

Figure 1:
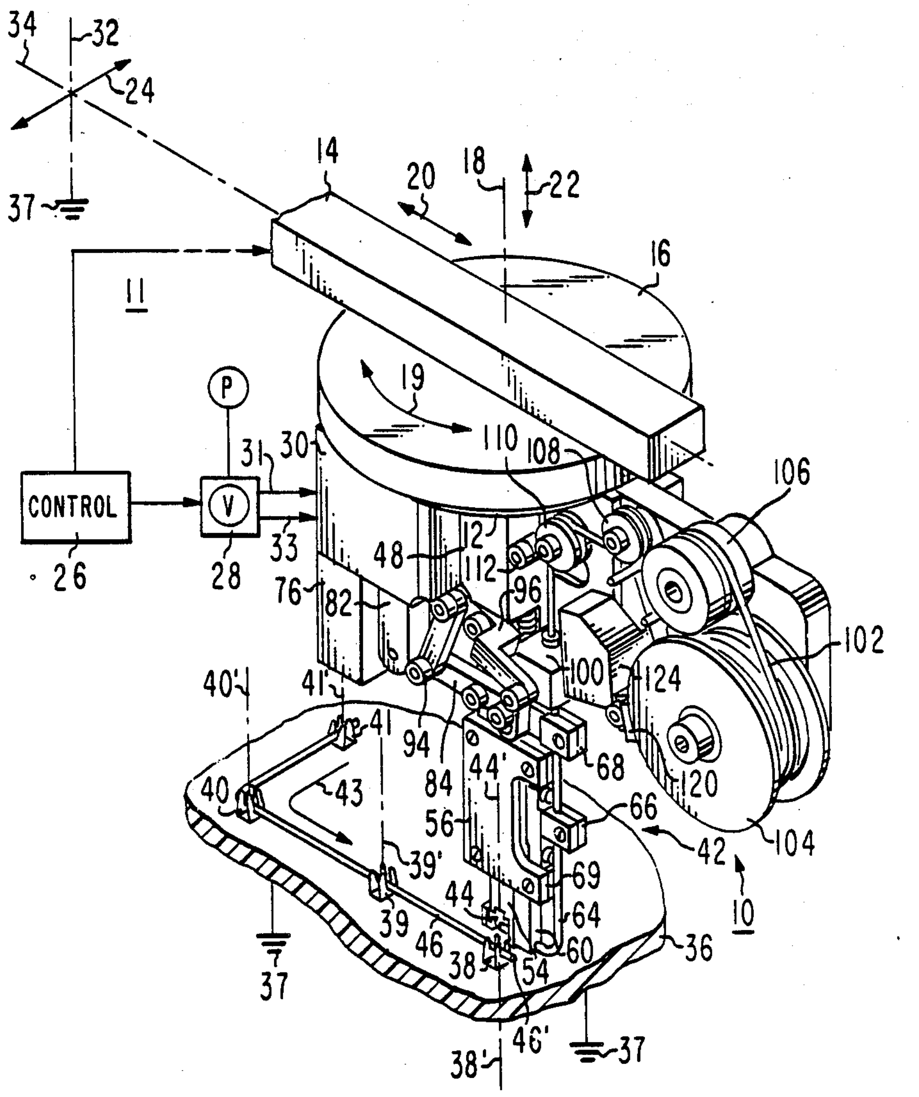
FIG. 1 is an isometric view of a robotic system illustrating one embodiment of the present invention.

In FIG. 1, wire insertion apparatus 10 includes a hand assembly 42 which has a wire insertion hand 44 located on a machine reference axis 44'. Assembly 42 includes a support head 12 which is releasably attached to and operated by a robotic system 11 comprising a robotic arm 14 and a manipulator 16 under control of a programmable control 26. Support head 12 is connected to manipulator 16 by a vacuum device (not shown). In one implementation, the manipulator 16 is rotatable about axis 18 and moves along arm 14 in directions 20 normal to axis 18. The arm 14 is attached to a mechanism (not shown) which can move the arm in directions 22 parallel to axis 18 or in directions 24 normal to directions 20 and 22. The control 26 is programmed to rotate manipulator 16 about axis 18 in directions 19, for displacing it in directions 20 relative to arm 14 and for displacing arm 14 in directions 22 and 24. The control 26, arm 14, and manipulator 16 are commercially available. These are programmed according to manufacturer's supplied instructions to move manipulator 16 in the desired one or more of directions 19, 20, 22, and 24. These displacements can place machine axis 44' anywhere in any x, y coordinate in any orientation in directions 19 relative to substrate 36.

Control 26 selectively opens and closes valve 28 on command to supply pressurized fluid, for example, air, from pressure source P to air cylinder 30 attached to apparatus 10. The valve 28 is attached to air cylinder 30 by two lines, 31 and 33. The pressurized air on lines 31 and 33 causes apparatus 10 to feed wire to the insertion hand 44, and to selectively sever the wire portion adjacent to hand 44, as will be described in more detail below. Control 26 is programmed to do all of the above-described functions, and functions to be described in more detail below, by a computer program which can be developed by one of ordinary skill in accordance with the robot manufacturer's supplied instructions and in accordance with a given implementation.

In the alternative to manipulator 16 rotating about axis 18 or in addition thereto, arm 14 may be hinged for rotation about axis 32 parallel to axis 18. Also, arm 14 may be hinged for rotation about axis 34 parallel to directions 20. The arm 14, shown as a single member, may also comprise a number of linkages, all robotically operated under the control of a control, such as control 26. In the latter implementation, the robotic arm 14, when rotated about axis 34, can insert wires onto insulation displacement terminals in different planes, e.g., horizontal and vertical planes. This would be most advantageous, for example, in a television receiver in which components and circuit elements to which wires are to be attached are often located in different orientations and planes at any x, y, and z coordinate.

In FIG. 1, substrate 36 which may be a printed circuit board or other structure, may have any orientation and may be located at a reference position by a support represented by symbols 37. In FIG. 1, the plane of substrate 36 is assumed horizontal for purposes of illustration. Secured to the substrate 36 are a plurality of insulation displacement terminals (IDTs) 38, 39, 40, and 41. Each IDT has a given reference location on the substrate 36 at respective axes 38', 39', 40', and 41' as determined by the support 37. The support 37 also locates robot axes 24, 32, 34, and 18 relative to the substrate 36 location. Apparatus 10 can automatically connect a single wire 46 to all IDTs 38-41. The number of IDTs which can be connected can be fewer or greater than the four shown. Further, the single wire 46 need not be connected to IDTs located in the same plane. For example, the reference axes 38', 39', and so forth, are illustrated parallel, but need not be in the most general implementation. An axis corresponding to axis 41' may be perpendicular to axis 40' which may be perpendicular to axis 39', and so forth. An important consideration is that the robotic system comprising arm 14, controller 26, and the associated linkages can move the hand assembly 42 in any desired orientation in any plane for serially inserting a wire onto the IDTs. Also, while the implementation herein discloses a hand assembly 42 for inserting a single wire into a single IDT, it should be understood that assembly 42 can include an array of multiple hands for simultaneous insertion of multiple wires into a corresponding array of multiple IDTs as might be present in IDT connectors described in the introductory portion above.

This point-to-point wiring, for example, includes in one wiring cycle, the steps of inserting wire 46 one terminal at a time, starting, for example, at terminal 41, continuing to terminal 40 in directions 43 and thence to terminals 39 and finally to terminal 38. The hand 44 is properly oriented and the machine axis 44' is aligned with each terminal axis 41'-38' at each insertion portion of the cycle. Upon completion of the insertion of the wire 46 to terminal 38 the severing portion of the hand assembly 42 automatically severs the wire 46 at point 46' and is ready to complete another wiring cycle or stopped, as desired.

The term "wiring cycle," as employed herein, means all steps by apparatus 10 to connect one or more wires, such as wire 46, to IDTs at multiple locations. The term "insertion cycle" means all steps by apparatus 10 in inserting a portion of one or more wires onto corresponding IDTs at a given location. For example, the wiring cycle may include rotation of hand 44 about axis 18, FIG. 1, and movement in direction 20 and 24 to align hand 44 with an IDT and the insertion cycle can include movement of hand 44 in directions 22.

Figure 2:
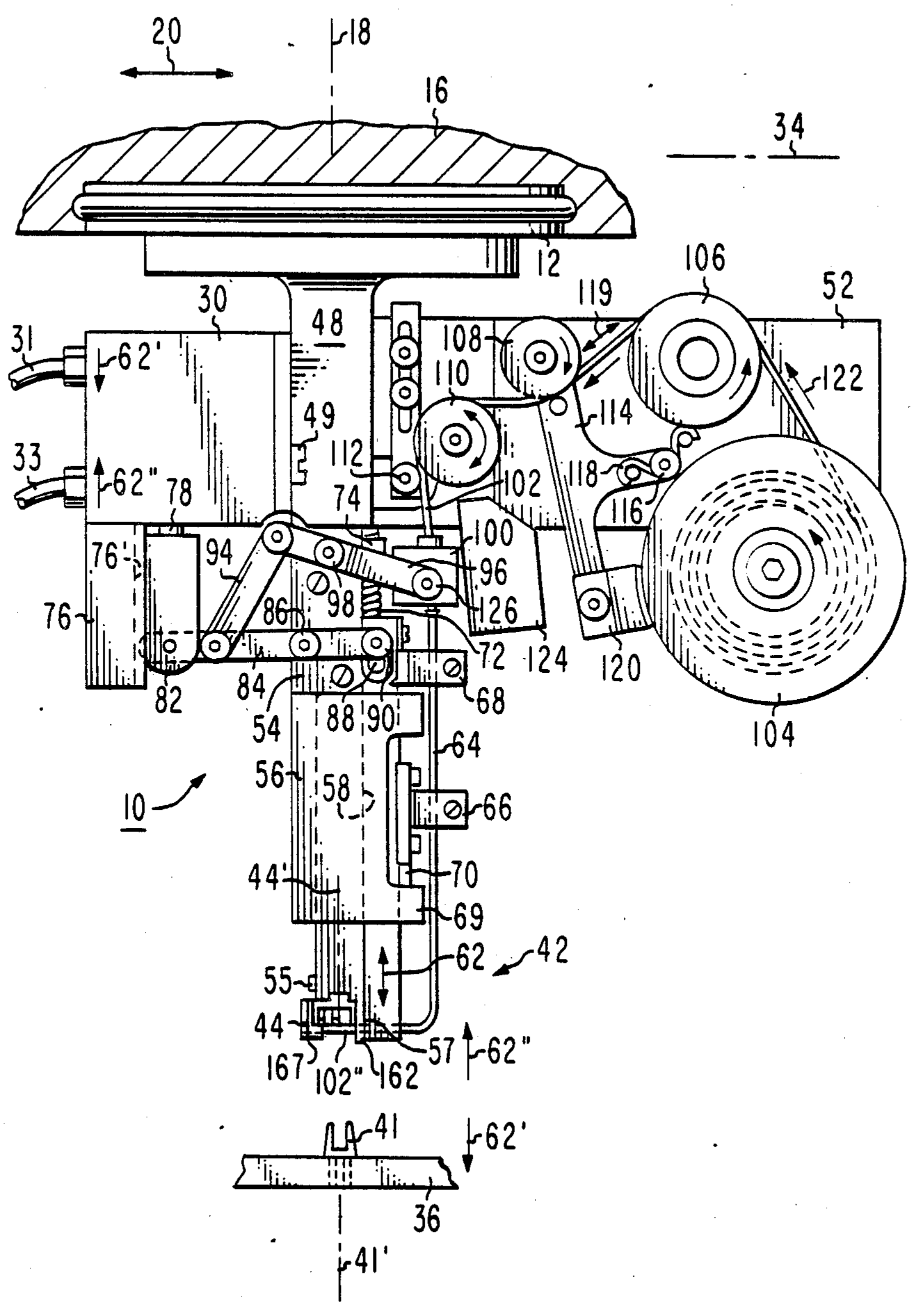
FIG. 2 is a front elevation view of the wire insertion portion of the apparatus of FIG. 1.
Figure 3:
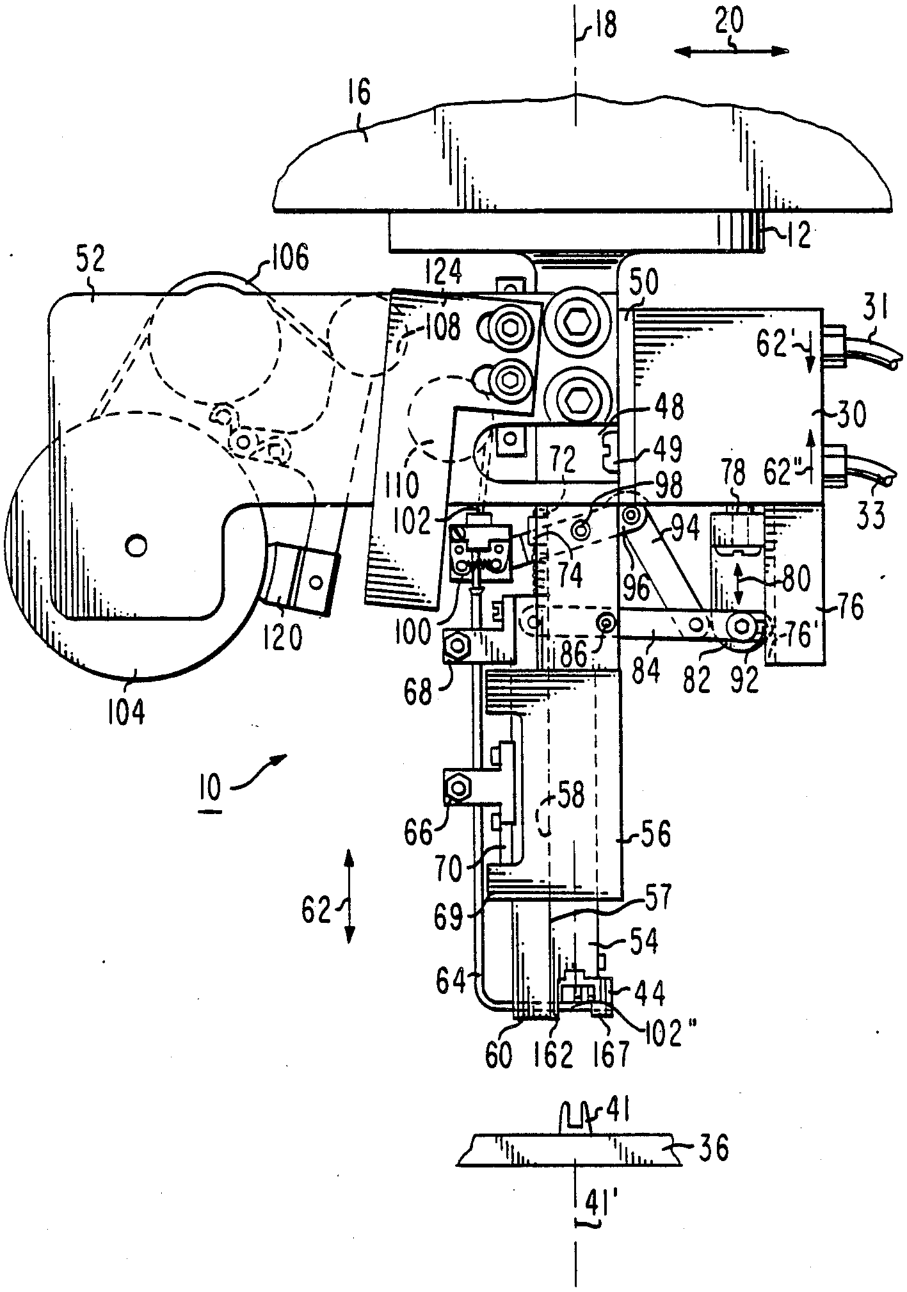
FIG. 3 is a rear elevation view of the apparatus of FIG. 2.

In FIGS. 2 and 3, support 48 attaches hand assembly 42 to support head 12. Air cylinder 30 is secured to support 48 by screws 49. Hand assembly 42 includes an extension member 54 which depends from support 48. Hand 44 is attached to the lower end of member 54 by screw 55. Hand 44 mates with a given IDT and is designed to be operated with a specific IDT terminal shape. C-shaped bracket 56 has a slot 58 in which is fixedly attached and embraced stationary extension member 54. Slot 58 also closely receives movable blade 60 which is in sliding engagement with edge surface 57 of member 54 and which moves relative to member 54 in directions 62, FIGURE 2. Wire feed tube 64 is attached to blade 60 by brackets 6 and 68 and displaces in directions 62 with the blade. Stop 70 is secured to bracket 66 and abuts leg 69 of bracket 56 to locate and align blade 60 with hand 44 in its lowermost position, direction 62'. Bracket 74 secures compression spring 72 to support 48 to resiliently urge blade 60 in direction 62' to the position set by stop 70.

Guide 76 is secured to the air cylinder 30 housing. Cylinder 30 piston rod 78 displaces in direction 62' in response to pressure on line 31 and in direction 62" in response to pressure on line 33. Rod 78 is connected to and displaces link 82 secured in a guide slot 76' in guide 76 for movement in directions 62. Fluid pressure on selected ones of lines 31 and 33 comprise pulses of sufficient duration to move link 82 connected to rod 78 the desired displacement. Link 84 is rotatably pinned at one end to the extended end of link 82 and midway at pivot pin 86 to member 54. The other end of link 84 has a slot 88. Pivot pin 90 movably secures link 84 via slot 88 to the upper end of blade 60. Pin 90 slides in slot 88 as the slot moves. One end of link 94 is pivotally pinned to link 84 between link 82 and pin 86. The other end of link 94 is pivotally pinned to an end of link 96. Link 96 is pivotally pinned at pin 98 about midway between its ends to extension member 54 and is pinned at its other end at pivot pin 126 to feed assembly 100. Links 84, 94, 96, and member 54 between pins 86 and 98 form a four-bar linkage.

The feed assembly 100 embraces wire 102 fed from a supply reel 104 via idle pulleys 106, 108, 110, and 112 attached to member 52 extending from support 48. Wire 102 passes through feed assembly 100 in a region next to the upper end of the wire feed tube 64. Pulley 108, FIG. 2, is mounted on a spring-biased crank 114 which is pivoted to member 52 at pin 116. Crank 114 pivots pulley 108 in directions 119 to provide tension on the wire 102 via spring 118. A brake 120 is attached to crank 114 to provide drag on wire 102 storage reel 104 via the bias of spring 118. Reel 104 is otherwise free to rotate in response to a pulling force on wire 102 in direction 122. As the tension on wire 102 increases, pulley 108 is so displaced as to displace brake 120 from reel 104 to reduce the drag on reel 104.

In FIGS. 2 and 3, feed assembly 100 guide member 124 is secured to member 52 for limiting the rotation of feed assembly 100 about pivot pin 126 as the assembly displaces generally in directions 62 in response to the rotation of link 96 about pin 98. Feed assembly 100 is permitted to rotate to allow wire 102 to freely displace relative to assembly 100.

Figure 6:
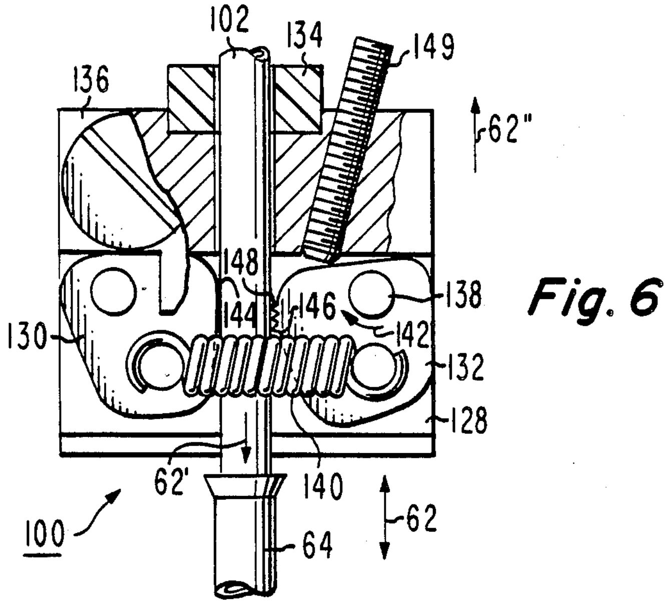
FIG. 6 is an elevation view of the wire feed mechanism illustrating the feed mechanism in more detail at one portion of a feed stage.

In FIG. 6, feed assembly 100 is shown in the feed initialize state ready to feed wire 102 in direction 62'. Assembly 100 includes a support 128, fixed jaw 130, and a movable jaw 132. A thermoplastic apertured wire guide bushing 134 is secured to support 128 for guiding the wire 102 between jaws 130 and 132. A cover plate 136 is secured to support 128 over jaws 130 and 132. Jaw 132 is pivoted to support 128 at pivot pin 138. A tension spring 140 is pinned to jaws 130 and 132 for pulling jaw 132 about pivot pin 138 in direction 142 toward jaw 130. Jaw 130 has a curved somewhat V-shaped surface 144 in sliding engagement with wire 102. Jaw 132 has a similar curved, somewhat V-shaped surface 146 which has serrations 148. An adjustment screw 149 is threaded to support 128 for setting the angular extent jaw 132 pivots about pin 138 in direction 142 to prevent wire 102 from being crushed between the jaws.

Figure 7:
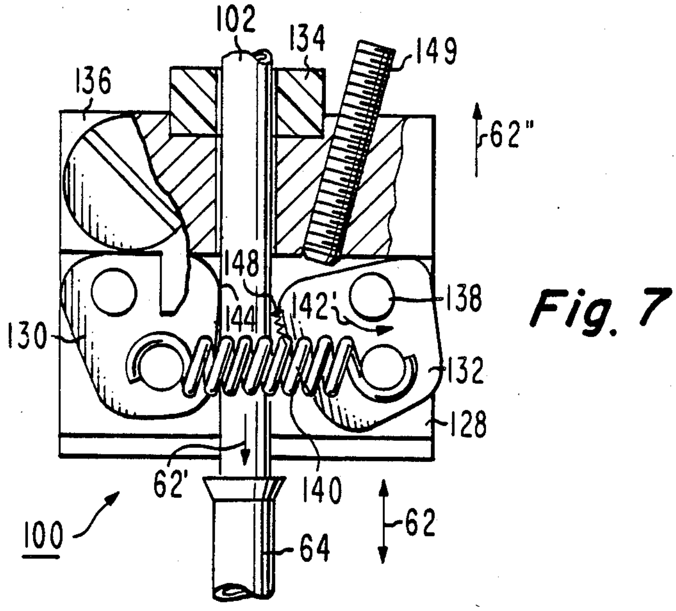
FIG. 7 is a view similar to that of FIG. 6 illustrating the wire feed mechanism during a second, different portion of a wire feed stage.

When the feed assembly 100 is displaced relative to wire 102 in direction 62", jaw 132 tends to rotate about pivot pin 138 in direction opposite 142, FIG. 7, direction 142', FIG. 6, and pulls against the tension of spring 140. This is because wire 102 engages serrations 148 and tends to pull on the jaw 132. The same kind of action occurs when feed assembly 100 remains stationary and a pulling force on wire 102 pulls the wire through the jaws in direction 62'. When feed assembly 100 displaces relative to the wire 102 in direction 62' opposite direction 62", friction between wire 102 and jaw 132 and the grabbing action of serrations 148 causes jaw 132 to pivot in direction 142, FIG. 6. This tends to cam the serrations 148 toward jaw 130, squeezing wire 102 between the jaws, precluding relative displacement of the wire between the jaws. Continued displacement of the assembly 100 in direction 62' forces wire 102 in direction 62', feeding the wire to insertion hand 44, FIG. 2, through feed tube 64. The jaws 130 and 132 thus serve as a one-way wire feed clutch.

Figure 8:
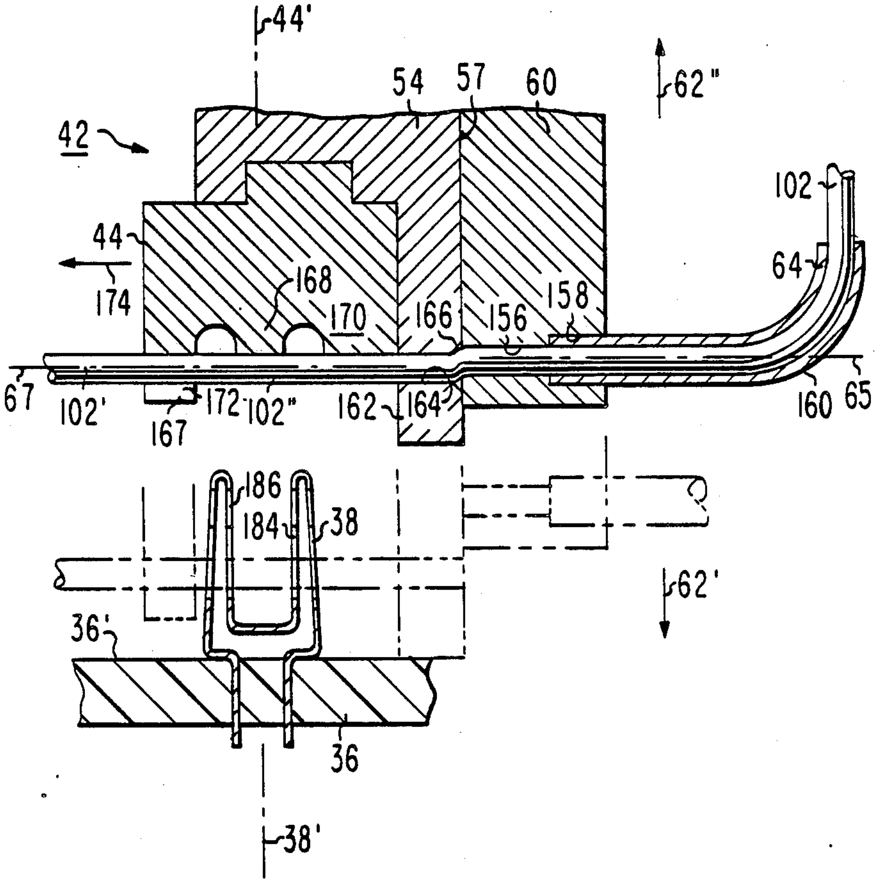
FIG. 8 is an elevation sectional view through the wire insertion hand and shearing portions of the embodiment of FIG. 1.

In FIG. 8, blade 60 includes an aperture 156 through which wire 102 passes. An enlarged aperture 158 receives and secures an end of tube 64. The tube 64 has a bend 160 for directing the wire 102 into aperture 156. Apertures 156 and 158 are aligned on axis 65 for directing wire 102 in direction 174. Member 54 includes a finger 162 having an aperture 164 for receiving wire 102 passing through blade 60 aperture 156. The aperture 164 has a conical ingress 166 for guiding the wire 102 into aperture 164. Aperture 164 and ingress 166 are aligned on axis 67 offset from axis 65 a small distance, e.g., one-fourth the diameter of wire 102. The reason for the offset of aperture 156 from aperture 164 is as follows. Wire 102 as it passes through bend 160 tends to take a curled set. This curled set tends to curl the wire 102 after it is fed through aperture 164 if aligned on axis 65. That curl tends to misalign the wire portion intended to be aligned with the fingers of hand 44. The offset of aperture 164 from aperture 156 bends the wire 102 at conical ingress 166 in a direction opposite to the bend caused by the tube bend 160. This action of bending the wire in the reverse direction tends to straighten the wire permitting it to remain aligned with the fingers of hand 44 as the wire is fed in direction 174. The wire is sufficiently stiff to remain in that alignment. The conical ingress 166 serves to thus guide the curled wire into the offset aperture 164. The bend by this offset alignment should be sufficient to remove the curl caused by tube 64 and thus straighten the wire. Therefore, no additional mechanism need be employed to align wire portion 102" with hand 44. When blade 60 displaces in direction 62", it shears the wire 102 at surface 57. For this reason, blade 60 need only move in direction 62" a relatively small amount sufficient to displace aperture 156 from alignment from aperture 164 and to shear wire 102.

Hand 44, FIG. 8, includes three wire insertion fingers 167, 168, and 170. These fingers are aligned with aperture 164 on axis 67 so that the straightened wire 102 passes adjacent to the extended end surfaces of the fingers. Finger 167 includes a slot 172 aligned with aperture 164 for assisting in maintaining the wire portion 102' in alignment with the fingers 167, 168, and 170 as the wire is fed in direction 174 from tube 64 or as hand 44 is displaced from terminal to terminal during the wiring cycle. During the latter, the wire is kept in sufficient tension as hand 44 moves from one terminal, e.g., 41, to a second terminal, e.g., 40, to keep wire portion 102' in slot 172. This ensures that portion 102" is aligned with the fingers in the insertion portion of the wiring cycle.

The fingers 167, 168, and 170 and the remainder of the hand 44 are adapted to mate with an insulation displacement terminal, e.g., terminal 38, to push the wire portion 102" into engagement with the IDT's tines 184 and 186. The IDTs may be the Quadra-mate terminal discussed above. The IDT may have any shape or configuration, such as barrel, rectangular, or planar, as known in the IDT art. The portions of assembly 42 at the end of the insertion stroke is shown in phantom. Finger 162 extends below insertion fingers 167, 168, and 170 an amount sufficient to locate against surface 36' of the substrate 36, if necessary, for example, to prevent the hand from crushing the IDT terminal in case of a malfunctioning control.

In the operation of the wire feed and severing mechanism, FIG. 2, a wire 102 is manually threaded around the idle and tension pulleys from reel 104, through feed assembly 100 and then into the feed tube 64. Pressure pulses are then successively applied to cylinder 30 alternatively to lines 31 and 33. A high pressure pulse on line 31 drives link 82 in direction 62', assuming the feed assembly 100 and link 82 are as shown in FIG. 2 prior to that pulse. The four-bar linkage comprising links 84, 94, 96, and the support 48 are thus activated. Pin 126 and the link 84 slot 88 are displaced about respective pivot pins 98 and 86, generally in direction 62". Slot 88 is sufficiently long to permit pin 90 and blade 60 to remain stationary as link 84 is displaced to the position shown in FIG. 4 during a major portion of this link 82 stroke. The position of the linkage of FIG. 4 is just prior to link 82 reaching the end of its stroke in direction 62' Link 82 completes its stroke in response to the same pulse on line 31 and continues to move in that stroke in direction 62' to the position of FIG. 5.

Figure 5:
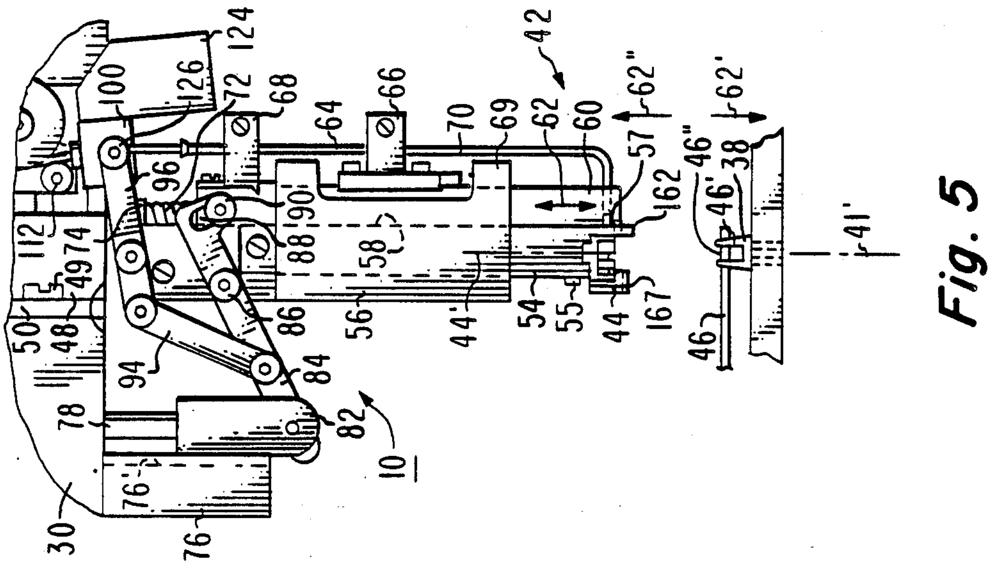
FIG. 5 is a front elevation view of a portion of the apparatus of FIG. 4 immediately subsequent to severing the wire from the IDT at the end of a wiring cycle.
Figure 4:
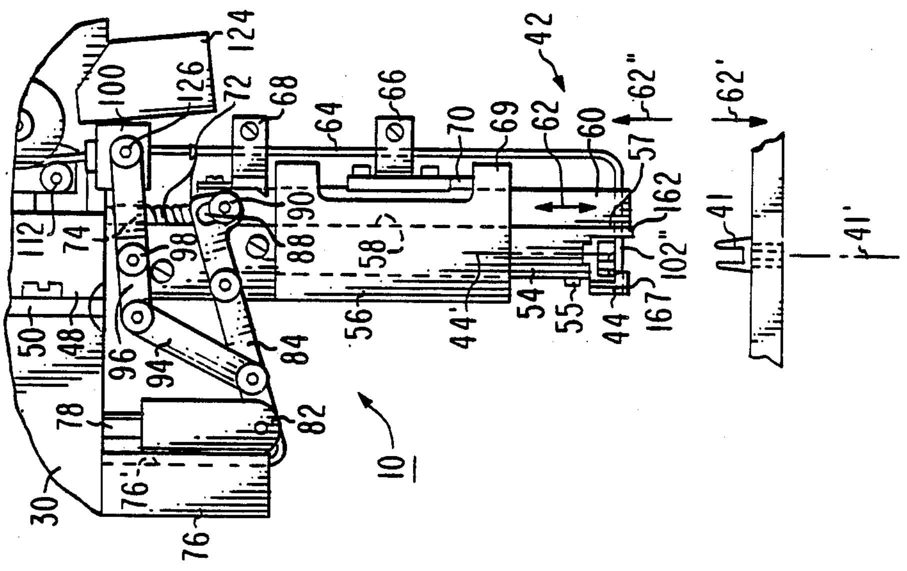
FIG. 4 is a front elevation view of a portion of the apparatus of FIG. 2 illustrating an intermediate wire feed stage.

The displacement of link 82 from the position of FIG. 4 to that of FIG. 5 causes the link 84 to now engage and displace pin 90 in direction 62" at slot 88. This displacement of pin 90 is sufficient to move the blade 60 to which pin 90 is attached in direction 62" a distance of at least the diameter of wire 102. When a wire is present in the apertures 156 and 164 at the interface between blade 60 and finger 162, FIG. 8, this blade displacement shears and severs wire portion 102", aligned in hand 44, from the wire in blade 60. The above displacement of pin 126 in direction 62" also moves the feed assembly 100 into its initialized position, FIG. 5, toward pulleys 110 and 112, direction 62". In FIG. 5, assembly 100 is ready to push wire 102 through tube 64 in direction 62'. The feed assembly 100 clutch jaws 130 and 132 are as shown FIG. 7 when the feed assembly 100 is moved to the position of FIG. 5. At the end of the link 82 stroke in direction 62', a pulse of pressurized air is supplied line 33. This pulse displaces link 82 in direction 62" to its position of FIG. 2, retracting shaft 78 and pushing the feed assembly 100 toward tube 64' in direction 62', feeding wire to hand 44.

As soon as the pressure on line 31 commences, the spring 72, FIG. 5, which is under compression as shown, resiliently forces blade 60 and the attached tube 64 in direction 62' to the initialized blade position of FIG. 2 as determined by stop 70. This automatically aligns apertures 156 and 164, FIG. 8. This alignment of the apertures is a relatively small portion of the feed stroke of feed assembly 100 such that substantially negligible length of wire is fed from blade 60 to leg 162, FIG. 8, at the start of the feed stroke. The conical ingress 166 allows for such slight feed of the wire into aperture 164 as the blade 60 is returned to its initialized state of FIGS. 2 and 8. The slot 88 of link 84 is of sufficient length to permit link 84 to return to its state of FIG. 2 without further movement of blade 60. However, this stroke displaces the feed assembly 100 a significant distance to feed the wire portion 102", FIG. 8, into alignment adjacent to fingers 167, 168, and 170 of hand 44. The feed stroke in retracting link 82, direction 62", causes the feed jaw 132 to immediately engage wire 102, FIG. 6, pushing the wire 102 in direction 62' through the tube 64 the desired length.

The feed stroke may include a feed portion in which blade 60 is not activated. Such a stroke may be repeated as necessary until the wire 102 portion 102", FIG. 2, is fully extended and aligned with the fingers 167, 168, and 170.

To activate the feed mechanism without activating the blade 60, assume the feed assembly is at the end of the feed stroke, FIG. 2. The cylinder 30 can then be pulsed with a short duration pulse sufficient to displace link 82 to the position of FIG. 4, just prior to link 84 engaging the blade 60 activating pin 90. This action returns the feed assembly to a feed initialize position. Link 82 is displaced a major portion of its stroke in moving from the position of FIG. 2 to that of FIG. 4. Link 82 is not moved to the position of FIGURE 5 through the wire severence portion of its stroke. At this time, a pulse is supplied line 33 to return link 82 to its retracted state of FIG. 2, which moves assembly 100 a distance sufficient to feed wire 102 into hand 44. These pulses can be repeated to feed any desired length of wire into and past hand 44.

The control 26, FIG. 1, can include manually operated switches for so pulsing cylinder 30. This may be desirable where a single stroke of assembly 100 is insufficient to completely feed the wire portion 102' into slot 172. With the wire portion 102" in place, FIG. 2, the apparatus 10 is ready to begin the wiring cycle. Control 26 is placed in the automatic mode where it is assumed the hand assembly 44 is in some given machine reference rest position.

In operation of apparatus 10, control 26, FIGURE 1, is loaded with a computer program which operates apparatus 10. The program includes information which directs the manipulator 16 from the initial machine reference rest position to the desired wiring position, locates the wire insertion hand 44 in the proper orientation relative to each IDT, causes the wire portion 102" to be inserted and severs the inserted wire 46 at point 46', FIG. 1, upon completion of the wiring cycle. The hand 44 is then automatically placed in the machine reference rest position and is oriented ready to repeat the above process at the same locations for a subsequent identical wiring layout. In the alternative, hand 44 may be programmed to wire the substrate 36 at different locations (not shown) in a separate, different but subsequent wiring cycle. The locations of the IDTs 38, 39, 40, and 41, FIG. 1, are loaded into the program of control 26 so that the axis 44' of jaw 44 is aligned with the corresponding axes 38', 39', and so forth, of the respective IDTs during the insertion portions of the wiring cycle. In addition, the program positions the hand 44 relative to each IDT as shown in FIG. 8.

When hand assembly 42, FIG. 1, is over IDT 41 ready to begin the insertion cycle, the mechanism is in the state of FIG. 2 with the link 82 retracted toward cylinder 30. The feed assembly 100 is in its lowermost position direction 62' close to tube 64 and the wire portion 102" is aligned with the fingers of hand 44. It is to be understood that the IDTs 38, 39, 40, and 41 have been preinserted into the substrate 36 with their IDT wire engagement tines preoriented to permit the wire 46 to run according to the desired layout. Control 26, FIG. 1, orients the hand assembly 42 in that orientation which permits the most efficient laying of the wire 46, FIGURE 1, from terminal to terminal in direction 43, FIG. 1.

Assuming hand 44 is aligned, as described above, with terminal 41, FIGS. 1 and 2, control 26 automatically lowers arm 14, causing hand 44 to push the wire portion 102", FIG. 2, into engagement with IDT 41, direction 62'. The arm 14 is then lifted in direction 62", FIG. 2, disengaging the hand 44 from the IDT 41. The wire portion 102" remains attached to the IDT 41. The manipulator 16, FIGS. 1 and 2, is then displaced so as to place the hand axis 44' in alignment with axis 40' and with terminal 40. In displacing the hand assembly 42, FIG. 1, from axis 41' to axis 40', wire 102 is pulled from reel 104. The drag from brake 120 and tension pulley 108 prevent reel 104 from feeding wire at a rate faster than the pull rate.

As assembly 42 is displaced from axis 41' to axis 40', the wire portion inserted in the IDT 41 provides sufficient force to drag wire 102 from the reel 104 through the idle pulleys and through tube 64. During this pulling action wire 102 always remains aligned with hand 44 by slot 172, FIG. 8. When the wire is dragged through the feed assembly 100, FIG. 7, feed jaw 132 displaces in direction 142' allowing wire 102 to be pulled therethrough in direction 62'.

When the wire 46 is attached to the last IDT of the wiring cycle, for example, IDT 38, FIG. 1, it will be recalled that feed assembly 100 is at its lowermost position, FIG. 2. While the hand 44 remains in contact with the last IDT of the wiring cycle, e.g., IDT 38, FIG. 1, the control 26 pulses cylinder 30 via line 31 causing piston rod 78, FIG. 2, to fully extend in one rapid stroke to the position of FIG. 5. This action automatically returns the feed assembly to its initialize position adjacent pulleys 110 and 112 without feeding wire and causes link 84 to pull blade 60 upward in direction 62", severing portion 102" of wire 46 from the remainder of wire 102 within blade 60. The assembly 42 is then lifted in upward direction 62" to space hand 44 from IDT 30. Then, a second pulse of pressurized fluid to cylinder 30 on line 33, FIG. 5, fully retracts piston rod 78 to the position of FIG. 2 automatically feeding wire 102 through tube 64 into alignment with hand 44 as shown in FIG. 2 ready to commence the next wiring cycle.

As mentioned above, the hand assembly 42 can include multiple hands, such as hand 44, and multiple blades, such as blade 60, aligned in an array for simultaneous insertion of a plurality of wires to a corresponding array of IDTs. In such an implementation, the wires may be fed from multiple magazines. The magazine or magazines need not be carried by the robot but may be located at a stationary storage location. Such multiple connections may be used, for example, to interconnect different printed circuit boards.

What is claimed is:

1. A wire insertion apparatus for robotically attaching a portion of an insulated wire to an insulation displacement terminal (IDT), the robot including an arm displaceable to any given orientation in any given plane, said apparatus comprising:

support means adapted to be attached to the robotic arm at a reference location on said arm; and a wire insertion tool depending from said support means and including a wire insertion hand aligned relative to said support means, said hand being adapted to mate with said terminal for pushing said wire portion into engagement with said terminal in response to a given displacement of said arm, said tool further including means for automatically feeding said wire portion into alignment with said hand and wire severing means for automatically selectively severing said portion from said feed means at the end of the wiring cycles to thereby permit connecting a wire to multiple IDTs regardless their relative orientation and plane location;

said severing means including a stationary element secured to said hand and a movable element cooperatively engage with the stationary element, said feed means being attached to said movable element whereby operation of the movable element severs said wire portion from said feed means.

2. The apparatus of claim 1 wherein said tool includes drive means and link means coupled to the drive means and having first and second links, said feed means including wire gripping means coupled to said wire and to said first link for selectively gripping and feeding the wire in one stroke direction of the first link between first and second positions of said gripping means, said severing means including blade means coupled to said second link and adapted to sever said wire between said feed means and said band when said gripping means is in a region adjacent said second position.

3. The apparatus of claim 1 wherein said tool includes actuating means and link means coupling said actuating means to said feed and severing means, said link means being adapted such that said actuating means selectively operates the feed means and wire severing means.

4. The apparatus of claim 3 wherein said means for selectively severing includes a wire shearing element, said actuating means comprises fluid operated piston means and said link means comprises a four-bar linkage wherein one bar is pivotally coupled to said piston at one bar end and to said shearing element at the other bar end; a second bar is pivotally connected to the first bar and to one end of a third bar, said third bar being pivotally connected at its other end to said feed means, said first and third bars being pivotally coupling between their respective ends to said support means.

5. The apparatus of claim 4 wherein said feed means includes wire gripping means embracing said wire for displacement in opposite directions and for feeding said wire in only one of said opposite directions.

6. The appartus of claim 4 wherein said one bar has a slot at said other end, said slot having sufficient length to operatively connect said one bar other end to said shearing element substantially in a region adjacent one end stroke position of said piston means.

7. Apparatus for automatically inserting a portion of a length of an insulated wire onto a terminal which deforms the wire and makes electrical contact with the wire conductor through the insulation, said apparatus comprising:

a manipulator including a control means for selective automatic displacement of the manipulator in at least a given direction from a reference position;

support means adapted to support a substrate bearing said terminal and for alinging said borne terminal at said reference position; and wire insertion means attached to said manipulator for displacement in said given direction, said insertion means including a hand adapted to mate with said terminal aligned therewith at the reference position for pushing said wire portion onto said terminal so that said conductor contacts said terminal, said insertion means including wire feed means and wire severing means responsive to said control means, said feed means for automatic selectively feeding said wire portion into alignment with and for operation by said hand prior to said pushing, said severing means for automatic selective severing of said portion from said feed means after said portion is connected to said terminal;

said feed means including clutch means for grabbing said wire and feeding said wire portion to said hand; said wire severing means including a wire severing element movable relative to a stationary element secured to and adjacent to said hand; and said insertion means further including actuator means and link means coupling said clutch means and movable element to said actuator means, said control means being coupled to said actuator means for selectively operating said clutch means and movable element via said link means.

8. The apparatus of claim 7 wherein said manipulator further includes means for displacing said manipulator in any one of a plurality of directions in a plane normal to said given direction for selectively placing said hand at a plurality of said reference positions; and said control means includes means for sequentially placing said hand at each said reference position and for selectively causing said hand and feed means to insert a separate, different wire portion at each position, said control means further including means for causing said severing means to sever said wire after the last of said portions is attached to its corresponding terminal to thereby electrically interconnect said plurality of terminals to said wire.

9. The apparatus of claim 7 wherein said reference position lies on a first axis parallel to said given direction, said manipulator including means for rotating said hand about a second axis parallel to the first axis in a plane normal to said first axis and for displacing said hand to a plurality of axes parallel to said first axis, each said plurality of axes defining a separate, different reference position.

10. The apparatus of claim 7 wherein said insertion means includes actuator means and link means, said feed means including clutch means, and said severing means including at least one element movable relative to a second element; said clutch means and said one element being coupled to said actuator means by said link means; said actuator means including means responsive to said control means for displacement between and to first and second positions; said link means, clutch means, and severing means being adapted such that said clutch means is in its initialize condition ready to feed said wire when the actuator means is in the first position and the severing means is in its initialize condition ready to sever said wire when the actuator means is in the second position, and displacement of the actuator means from the first to second positions causes the clutch means to feed said wire and displacement of the actuator means from the second to the first position causes said severing means to sever said wire.

11. The apparatus of claim 7 wherein said insertion means includes drive means responsive to said control means for displacement in first and second strokes between and to first and second positions, said feed means including coupling means responsive to said first stroke from said first position to said second position for feeding said wire and for initializing said severing means, said coupling means being responsive to said second stroke from said second position to said first position for operating said severing means and initializing said feed means.

12. The apparatus of claim 11 wherein said drive means is further responsive to said control means for displacing in third and fourth strokes between and to said first position and a third position located between said first and second positions such that said feed means feeds said wire in said third stroke to said third position without initializing said severing means and said fourth stroke to said first position initializes said feed means.

13. The apparatus of claim 11 wherein said drive means includes a fluid operated piston responsive to said control means, said coupling means includes link means coupled to said piston, feed means and severing means, said link means being constructed so that said feed means is selectively placed in a feed state in a selected major portion of a given stroke of said piston and said severing means is placed in an initialize state during said major portion of said stroke and operated in a severing mode during a minor end portion of said given stroke such that operation of said piston in said major stroke portion feeds said wire without severing said wire.

14. A wire insertion apparatus for robotically attaching a portion of an insulated wire to an insulation displacement terminal (IDT), the robot including an arm displaceable to any given orientation in any given plane, said apparatus comprising:

support means adapted to be attached to the robotic arm at a reference location on said arm; and a wire insertion tool depending from said support means and including a wire insertion hand aligned relative to said support means, said hand being adapted to mate with said terminal for pushing said wire portion into engagement with said terminal in response to a given displacement of said arm, said tool further including means for automatically feeding said wire portion into alignment with said hand and wire severing means for automatically selectively severing said portion from said feed means at the end of the wiring cycle to thereby permit connecting a wire to multiple IDTs regardless their relative orientation and plane location;

said tool including drive means and link means coupled to the drive means and having first and second links, said feed means including wire gripping means coupled to said wire and to said first link for selectively gripping and feeding the wire in one stroke direction of the first link between first and second depositions of said gripping means, said severing means including blade means coupled to said second link and adapted to sever said wire between said feed means and said hand when said gripping means is in a region adjacent said second position.

15. A wire insertion apparatus for robotically attaching a portion of an insulated wire to an insulation displacement terminal (IDT), the robot including an arm displaceable to any given orientation in any given plane, said apparatus comprising:

support means adapted to be attached to the robotic arm at a reference location on said arm; and a wire insertion tool depending from said support means and including a wire insertion hand aligned relative to said support means, said hand being adapted to mate with said terminal for pushing said wire portion into engagement with said terminal in response to a given displacement of said arm, said tool further including means for automatically feeding said wire portion into alignment with said hand and wire severing means for automatically selectively severing said portion from said feed means at the end of the wiring cycle to thereby permit connecting a wire to multiple IDTs regardless their relative orientation and plane location;

said tool including actuating means and link means coupling said actuating means to said feed and severing means, said link means being adapted such that said actuating means selectively operates the feed means and wire severing means, said means for selectively severing including a wire shearing element, said actuating means comprises fluid operated piston means and said link means comprises a four-bar linkage wherein one bar is pivotally coupled to said piston at one bar end and to said shearing elememt at the other bar end, a second bar is pivotally connected to the first bar and to one end of a third bar, said third bar being pivotally connected at its other end to said feed means, said first and third bars being pivotally coupled between their respective ends to said support means.

16. Apparatus for automatically inserting a portion of a length of an insulated wire onto a terminal which deforms the wire and make electrical contact with the wire conductor through the insulation, said apparatus comprising:

a manipulator including a control means for selective automatic displacement of the manipulator in at least a given direction from a reference position;

support means adapted to support a substrate bearing said terminal and for aligning said borne terminal at said reference position; and wire insertion means attached to said manipulator for displacement in said given direction, said insertion means including a hand adapted to mate with said terminal aligned therewith at the reference position for pushing said wire portion onto said terminal so that said conductor contacts said terminal, said insertion means including wire feed means and wire severing means responsive to said control means, said feed means for automatic selectively feeding said wire portion into alignment with and for operation by said hand prior to said pushing, said severing means for automatic selective severing of said portion from said feed means after said portion is connected to said terminal;

said insertion means including actuator means and link means, said feed means including clutch means, and said severing means including at least one element movable relative to a second element; said clutch means and said one element being coupled to said actuator means by said link means; said actuator means including means responsive to said control means for displacement between and to first and second positions; said link means, clutch means, and severing means being adapted such that said clutch means is in its initialize condition ready to feed said wire when the actuator means is in the first position and the severing means is in its initialize condition ready to sever said wire when the actuator means is in the second position, and displacement of the actuator means from the first to second positions causes the clutch means to feed said wire and displacement of the actuator means from the second to the first position causes said severing means to sever said wire.

* * * * *